United States Patent

Oda et al.

[11] Patent Number: 6,162,668
[45] Date of Patent: Dec. 19, 2000

[54] METHOD OF MANUFACTURING A SEMICONDUCTOR DEVICE HAVING A LIGHTLY DOPED CONTACT IMPURITY REGION SURROUNDING A HIGHLY DOPED CONTACT IMPURITY REGION

[75] Inventors: Hidekazu Oda; Tomohiro Yamashita, both of Tokyo, Japan

[73] Assignee: Mitsubishi Denki Kabushiki Kaisha, Tokyo, Japan

[21] Appl. No.: 09/260,737

[22] Filed: Mar. 3, 1999

Related U.S. Application Data

[62] Division of application No. 08/711,660, Sep. 9, 1996, Pat. No. 5,945,710.

[30] Foreign Application Priority Data

Mar. 7, 1996 [JP] Japan ......................................... 8-49771

[51] Int. Cl.[7] ..................... H01L 21/336; H01L 21/8234
[52] U.S. Cl. .......................... 438/197; 438/299; 438/301; 438/306; 438/527; 438/529; 438/533
[58] Field of Search ................................. 438/197, 217, 438/229, 230, 23.1, 232, 233, 299, 301, 303, 304, 305, 306, 307, 521, 519, 523, 514, 529, 533, 527

[56] References Cited

U.S. PATENT DOCUMENTS

| | | | |
|---|---|---|---|
| 4,114,256 | 9/1978 | Thibault | 438/476 |
| 4,382,826 | 5/1983 | Pfleiderer et al. | 438/286 |
| 4,404,733 | 9/1983 | Sasaki | 438/301 |
| 4,445,270 | 5/1984 | Hsu | 438/232 |
| 4,610,076 | 9/1986 | Ueda | 438/307 |
| 4,801,555 | 1/1989 | Holley et al. | 438/307 |
| 4,928,163 | 5/1990 | Yoshida et al. | 257/344 |
| 5,132,753 | 7/1992 | Chang et al. | 257/655 |
| 5,250,832 | 10/1993 | Murai | 257/306 |
| 5,429,956 | 7/1995 | Shell et al. | 438/291 |
| 5,498,887 | 3/1996 | Ohki et al. | 257/239 |
| 5,556,798 | 9/1996 | Hong | 438/257 |
| 5,576,574 | 11/1996 | Hong | 438/291 |
| 5,679,602 | 10/1997 | Lin et al. | 438/298 |

FOREIGN PATENT DOCUMENTS

| | | |
|---|---|---|
| 64-76757 | 3/1989 | Japan . |
| 2-33924 | 2/1990 | Japan . |
| 4-363019 | 12/1992 | Japan . |

*Primary Examiner*—Stephen D. Meier
*Assistant Examiner*—Jamie L. Davis
*Attorney, Agent, or Firm*—Oblon, Spivak, McClelland, Maier & Neustadt, P.C.

[57] ABSTRACT

A high withstand voltage semiconductor device includes a semiconductor substrate of a first conductivity type, a metallic wiring formed on a surface of the semiconductor substrate and having a contact face with said semiconductor substrate, a highly doped impurity region formed within the semiconductor substrate below the contact face and of a second conductivity type, a lightly doped impurity region formed around the highly doped impurity region and of the second conductivity type, and a MOSFET with a second conductivity-type having a source or drain region formed on the surface of the semiconductor substrate and electrically connected to the metallic wiring through the impurity regions.

9 Claims, 10 Drawing Sheets

METHOD OF MANUFACTURING A SEMICONDUCTOR DEVICE HAVING A LIGHTLY DOPED CONTACT IMPURITY REGION SURROUNDING A HIGHLY DOPED CONTACT IMPURITY REGION

This appln is a Div of Ser. No. 08/711,660 filed Sep. 9, 1996, U.S. Pat. No. 5,945,710.

BACKGROUND OF THE INVENTION

1. Field of the Invention

The present invention relates to a semiconductor device provided with a MOSFET, and more particularly to a semiconductor device having an impurity region in a contacting portion of source and drain regions of the MOSFET and a metallic wiring and a manufacturing method thereof.

2. Description of the Prior Art

FIG. 23 shows a sectional structure of the conventional MOSFET. The withstand voltage of a MOSFET depends on the impurity distribution at the end of a drain on the side of a channel. For this reason, the high withstand voltage of the conventional transistor has been realized by optimizing the condition of forming source and drain diffused layers 6a, 6b and a channel region so as to relax the drain electric field.

Miniaturizing the device, however, has been accompanied by an increase in the impurity concentration within the device and a reduction in the depth of the source and drain diffused layers 6a, 6b. This strengthens the drain electric field and hence reduces the withstand voltage at the drain end.

On the other hand, at contact areas 10, in order to prevent metallic wirings 9 made of e.g. aluminum (Al) from sinking deeper than the source and drain diffused layers 6a, 6b to be brought into contact with the p-type substrate, an n-type diffused layers 11 is formed.

Since the diffused layer 11 can not be micro-miniaturized, at a certain point of development of micro-miniaturizing, the diffused layer 11 at the contact area sinks deeper than the source and drain regions 6a, 6b.

In this case, since the diffused layer 11 at the contact area has a higher impurity concentration than the low impurity diffused layer 6a of the drain, the withstand voltage at the contact area is lower than that of the drain diffused layer. Accordingly, the withstand voltage of the device depends on the contact diffused layer. Thus, realization of the high withstand voltage of the transistor requires that of the contact area.

SUMMARY OF THE INVENTION

An object of the present invention is to provide a semiconductor device with an excellent withstand voltage performance and a manufacturing method thereof.

In accordance with the first aspect of the present invention, there is provided a semiconductor device comprising a semiconductor substrate of a first conductivity type; a metallic wiring formed on a surface of the semiconductor substrate and having a contact face with the semiconductor substrate; a highly doped impurity region formed within the semiconductor substrate below the contact face and of a second conductivity type; a lightly doped impurity region formed around the highly doped impurity region and of the second conductivity type; and a MOSFET of a second conductivity-type having a source and a drain region formed on the surface of the semiconductor substrate and electrically connected to the metallic wiring through the impurity regions.

In accordance with the second aspect of the present invention, there is provided a semiconductor device comprising a semiconductor substrate of a first conductivity type; a metallic wiring formed on a surface of the semiconductor substrate and having a contact face with the semiconductor substrate; a highly doped impurity region formed within the semiconductor substrate below the contact face and of a second conductivity type; and a MOSFET of a second conductivity-type having a source and a drain region of a lightly doped impurity region formed on the surface of the semiconductor substrate and electrically connected to the metallic wiring through the impurity region, wherein the depth of the highly doped impurity region is larger than that of the source or drain region.

In accordance with the third aspect of the present invention, there is provided a semiconductor device comprising: an interlayer insulating film formed on a surface of a semiconductor substrate of a first conductivity type and having a contact hole opening into the surface of the semiconductor substrate; a contact layer including highly doped impurities of a second conductivity type formed on the semiconductor substrate within the contact hole; a metallic wiring electrically connected to the contact layer and extending onto the interlayer insulating film through the contact hole; and an MOSFET having a source and drain region formed in contact with the contact layer within the semiconductor substrate below the contact hole.

In accordance with the fourth aspect of the present invention, there is provided a method of manufacturing a semiconductor device comprising the steps of: forming a MOSFET of a second conductivity-type on a surface of a semiconductor substrate of a first conductivity type; on the semiconductor substrate, forming an interlayer insulating film having a contact hole opening into a source or drain of the MOSFET; forming a highly doped impurity region of the second conductivity type within the semiconductor substrate below the bottom of the contact hole; forming a lightly doped impurity region of the second conductivity type around the highly doped impurity region within the semiconductor substrate; and forming a metallic wiring electrically connected to the highly doped impurity region and extending onto the interlayer insulating film through the contact hole.

In accordance with the fifth aspect of the present invention, there is provided a method of manufacturing a semiconductor device comprising the steps of: forming a MOSFET of a second conductivity-type having a source or a drain region of a lightly doped impurity region on a surface of a semiconductor substrate of a first conductivity type; on the semiconductor substrate, forming an interlayer insulating film having a contact hole opening into a source and a drain of the MOSFET; within the semiconductor substrate below the bottom of the contact hole, forming a highly doped impurity region of the second conductivity type at a more shallow level than the source or drain region; and forming a metallic wiring electrically connected to the highly doped impurity region and extending onto the interlayer insulating film through the contact hole.

In accordance with the sixth aspect of the present invention, there is provided a method of manufacturing a semiconductor device comprising the steps of: forming a MOSFET of a second conductivity-type on a semiconductor substrate of a first conductivity type; on the semiconductor substrate, forming an interlayer insulating film having a contact hole opening into a source or drain region of the MOSFET; forming an epitaxial layer containing highly doped impurities of the second conductivity type at a position abutting on the source or drain region within the contact hole; and forming a metallic wiring electrically connected to the epitaxial layer and extending onto the interlayer insulating film through the contact hole.

The above objects and features of the present invention will be more apparent from the following description taken in conjunction with the accompanying drawings.

DESCRIPTION OF THE PREFERRED EMBODIMENTS

Embodiment 1

Figure 1:
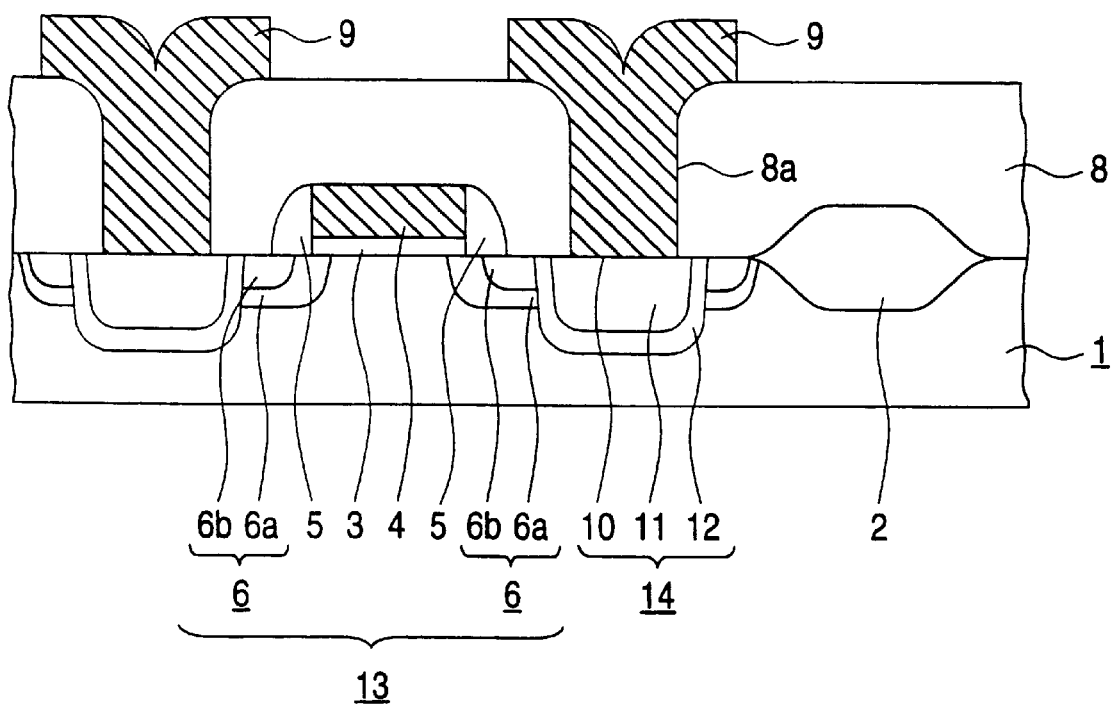
FIG. 1 is a major sectional view of the first embodiment of the present invention.

Now, referring to FIGS. 1 to 7, an explanation will be given of the first embodiment of the present invention. FIG. 1 is a major sectional view showing the first embodiment of the present invention. In this figure, reference numeral 1 denotes a semiconductor substrate made of P-type silicon (Si), and reference numeral 2 denotes an insulating film formed on a surface of the semiconductor substrate and serving as an isolation oxide film for electrically isolating elements from each other.

Reference numeral 3 denotes a gate insulating film made of silicon oxide formed on the semiconductor substrate 1; 4 denotes a gate electrode of polycrystalline silicon (poly-Si) formed on the gate insulating film 3; 5 denotes one of side walls of silicon oxide formed on both sides of the gate insulating film 3 and gate electrode 4; 6a denotes one of lightly doped areas of respective N-type source and drain regions 6 which are located at a portion just below the gate electrode 4 and also its outside; and 6b denotes one of N-type impurity highly doped areas of respective source and drain regions 6 formed in the surface of the semiconductor substrate, formed at positions more shallow than the lightly doped areas 6a and surrounded by it, respectively.

Reference numeral 8 denotes an interlayer insulating film formed on the semiconductor substrate 1 and having contact holes 8a opening into the surface of the semiconductor substrate 1; 9 denotes one of metallic wirings made of e.g. aluminum (Al) each having a contact face with the semiconductor substrate 1 at the bottom of the contact hole 8a and extending onto the interlayer insulating film 8 from the contact face 10 through the contact hole 8a; and 11 denotes one of highly doped N-type impurity regions each formed within the semiconductor substrate below the contact face 10 (for example, their impurity concentration is $1\times10^{19}$ cm$^{-3}$ or more). Reference numeral 12 denotes one of lightly doped N-type impurity regions each formed around the highly doped N-type impurity region 11 within the semiconductor substrate 1 (their impurity concentration is substantially equal to that of the lightly doped areas 6b of the source and drain regions 6, and is e.g. $1\times10^{18}$ to $1\times10^{19}$ cm$^{-3}$).

It should be noted that the metallic wiring 9 and the source or drain region 6 are electrically connected to each other through these impurity regions 11 and 12.

Reference numeral 13 denotes an N-channel MOSFET including the gate electrode 4, source and drain regions 6, etc., and reference numeral 14 denotes a contact area including the contact face 10, impurity regions 11, 12, etc.

Now, referring to FIGS. 2 to 7, an explanation will be given of a method of manufacturing the semiconductor device thus constructed. FIGS. 2 to 7 show the semiconductor device according to the first embodiment in the order of manufacturing steps.

Figure 2:
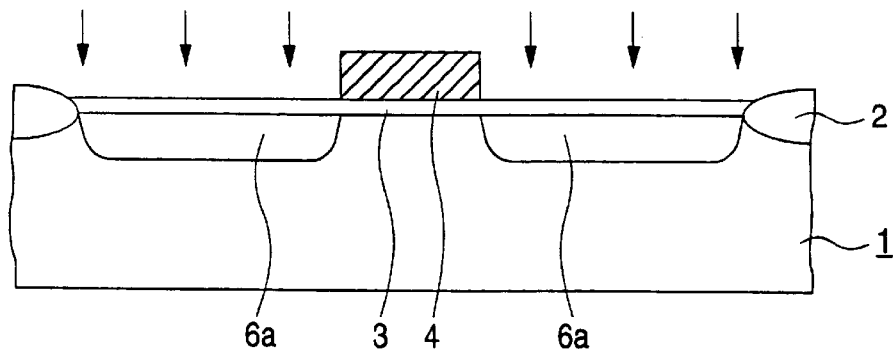
FIGS. 2 to 7 are major sectional views showing the first embodiment of the present invention in the order of manufacturing steps.

First, as shown in FIG. 2, on a surface of the semiconductor substrate 1, the silicon oxide film constituting the gate insulating film 3 and the poly-Si layer constituting the gate electrode 4 are successively stacked. Using the photolithography technique, the gate insulating film 3 and the gate electrode 4 are formed.

Using as a mask these gate insulating film 3, the isolation oxide film 2, gate electrode 4, N-type impurities such as arsenic (As) ions or phosphorus (P) ions are ion-implanted into the substrate 1, thus forming the lightly doped areas 6a of the source and drain regions 6.

Figure 3:
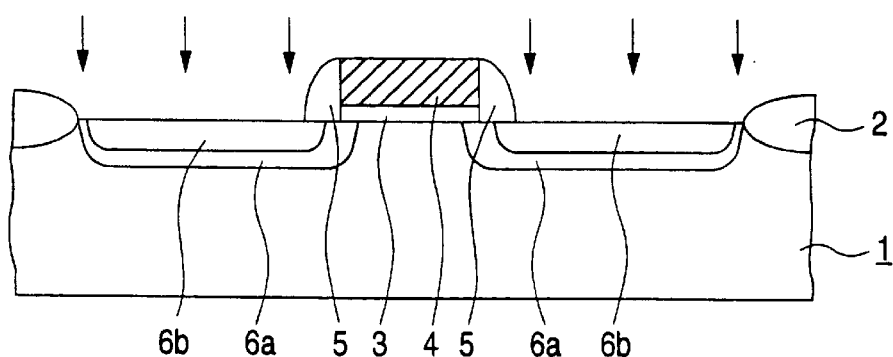

As shown in FIG. 3, on the surface of the semiconductor substrate 1 and the gate electrode 4, a TEOS film constituting the side walls 5 is formed, and by anisotropic etching of the TEOS film, the side walls 5 are formed.

Using as a mask the side walls 5, gate insulating film 3, gate electrode 4 and isolation oxide film 2, N-type impurity ions such as phosphorus ions are implanted into the substrate 1 to highly dope the shallow areas of the source and drain regions 6, thus forming the highly doped areas 6b of the source and drain regions 6.

Figure 4:
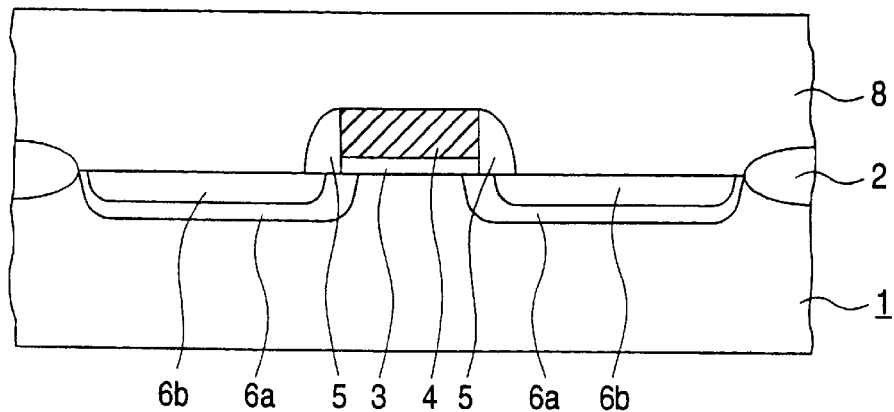

As shown in FIG. 4, on the surface of the semiconductor substrate 1, the interlayer insulating film 8 made of a silicon oxide film is formed. Thereafter, by etching, a substantially flat surface is obtained.

Figure 5:
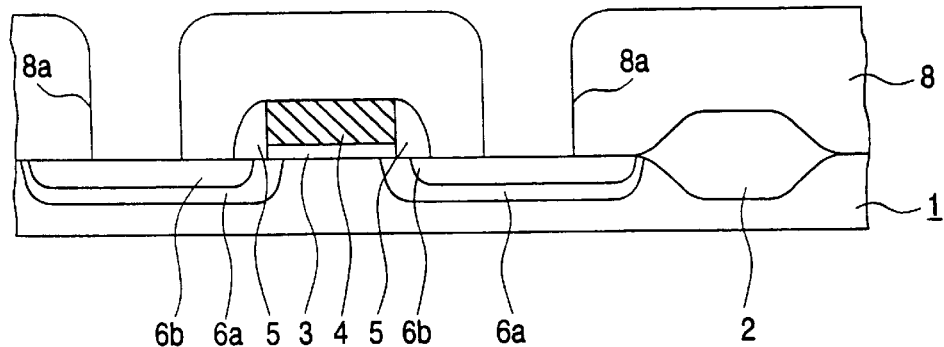

As shown in FIG. 5, using photolithography, contact holes 8a each opening into the corresponding source or drain region 6 are formed.

Figure 6:
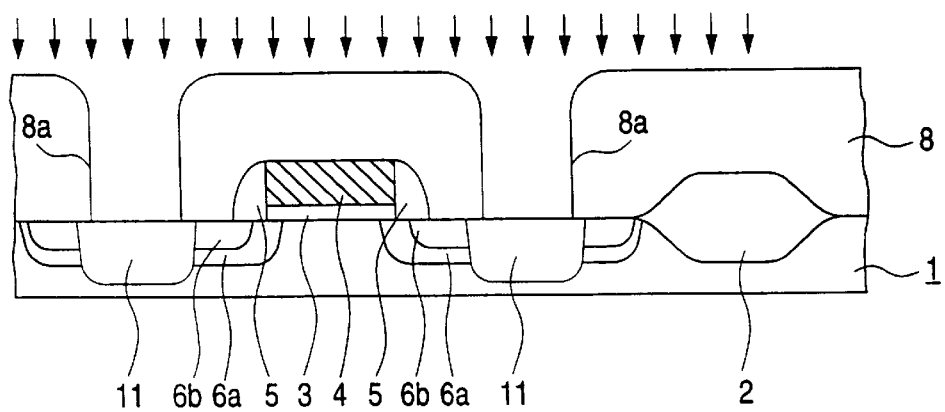

As shown in FIG. 6, within the semiconductor substrate 1 below the bottom of each of the contact holes 8a, using as a mask the interlayer, N-type impurities are ion-implanted with a high impurity concentration and low energy to form the N-type highly doped impurity regions 11.

Specifically, for example, phosphorus ions that are N-type impurities are ion-implanted with implanting energy of 30 to 100 KeV and dose of $1\times10^{14}$ to $1\times10^{15}$ cm$^{-2}$.

Figure 7:
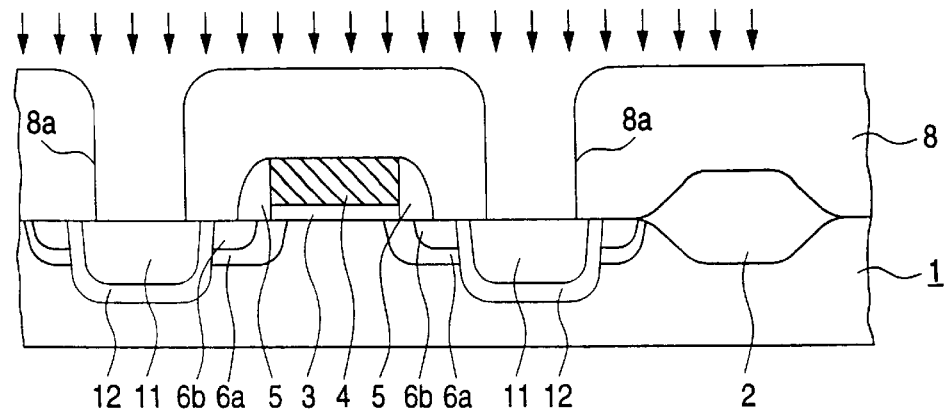

As shown in FIG. 7, within the semiconductor substrate 1 below the bottom of the contact holes 8a used to form the highly doped impurity regions 11, using the interlayer insulating film 8 as a mask, N-type impurities are ion-implanted with a low implant dose and implant energy of 1.5–4 times as large as that used in forming the highly doped impurity regions 11, thus forming the N-type lightly doped impurity regions 12.

Specifically, for example, phosphorus ions that are N-type impurities are ion-implanted with implanting energy of 50 to 200 KeV and dose of $1\times10^{13}$ to $3\times10^{13}$ cm$^{-2}$.

Within the contact hole 8a and on the interlayer insulating film 8, a metallic wiring layer 9a constituting the metallic wiring 9 is formed. Using the ordinary photolithography, as shown in FIG. 1, the metallic wiring 9 is formed.

In the semiconductor device thus constructed, the lightly doped impurity region 12 is formed around the highly doped impurity region 11. For this reason, the lightly doped impurity region 12 serves to relax the electric field applied to the highly doped impurity region 11 so that the withstand voltage of the contact area 14 can be boosted. Further, since the depletion layer of the lightly doped region 12 is extended, the junction leak or junction capacitance of the contact area 14 can be reduced.

In this embodiment, the conductivity type of each of the semiconductor substrate 1, source and drain regions 6, impurity regions 11, 12 can be reversed (for example, an N-type Si substrate is used as the semiconductor substrate 1). In this case also, the same advantage or effect as described above can be obtained.

Embodiment 2

Figure 8:
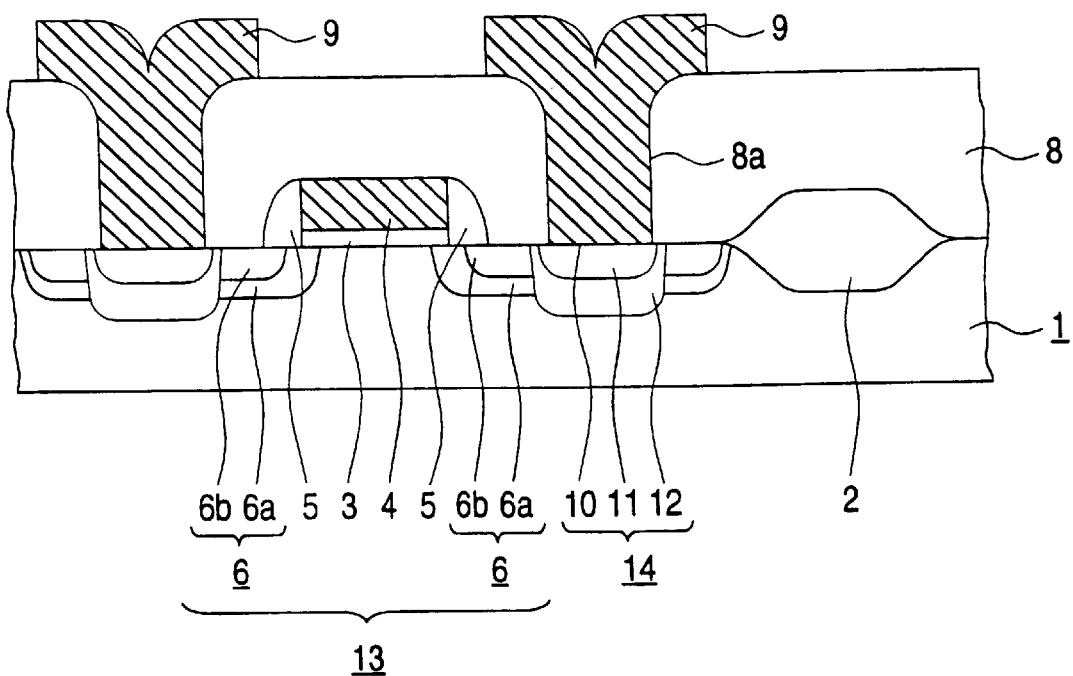
FIG. 8 is a major sectional view of the second embodiment of the present invention.

FIG. 8 shows the second embodiment of the present invention. This embodiment is different from the first embodiment only in that the depth of the highly doped impurity region 11 from the contact face 10 is equal to or smaller than that of the lightly doped impurity area 6a of the source and drain regions 6.

Figure 9:
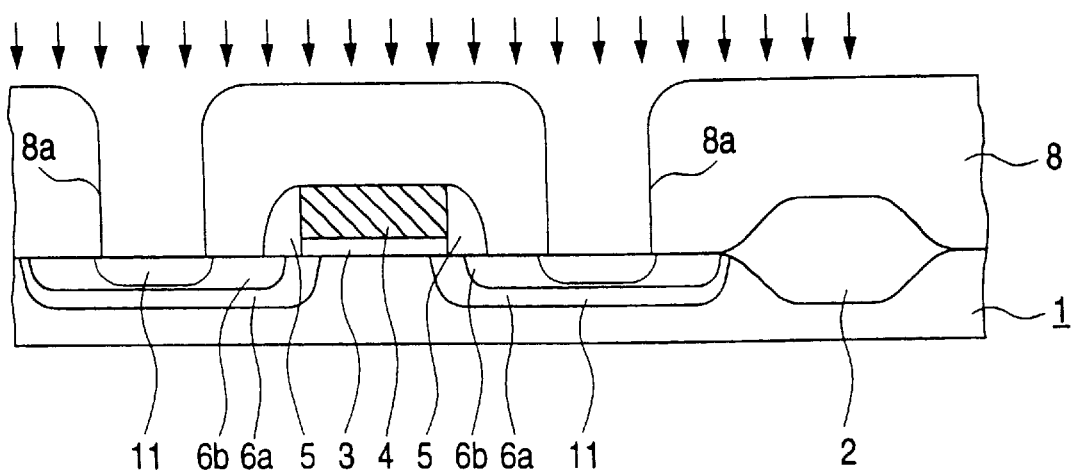
FIGS. 9 to 10 are major sectional views showing the second embodiment of the present invention in the order of manufacturing steps.
Figure 10:
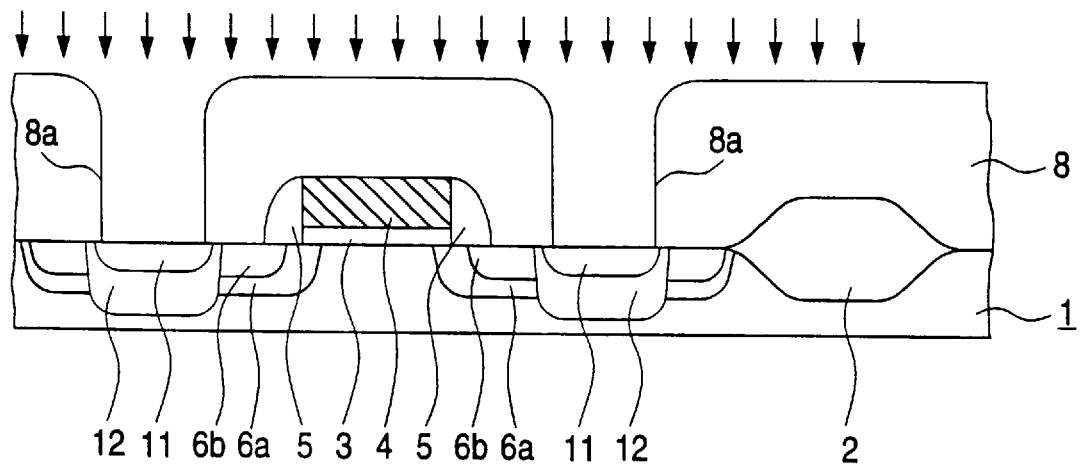

Referring to FIGS. 9 and 10, an explanation will be given of a method of manufacturing the semiconductor device according to the second embodiment. FIGS. 9 and 10 show the semiconductor device according to this embodiment in the order of manufacturing steps.

The process up to the step of forming the contact holes 8a as shown in FIG. 5 in the first embodiment is adopted in this embodiment also.

As shown in FIG. 9, by ion-implantation using the interlayer insulating film 8 as a mask, the highly doped impurity regions 11 are formed.

In the first embodiment, in order to obtain the highly doped impurity regions 11, phosphorus ions that are N-type impurities were ion-implanted with implanting energy of 30 to 100 KeV and dose of $1\times10^{14}$ to $1\times10^{15}$ cm$^{-2}$. On the other hand, in this embodiment, using the interlayer insulating film 8 as a mask, by the ion-implantation of arsenic (As) or phosphorus (P) with low energy and high dose, the highly doped impurity regions 11 are obtained. Specifically, in this embodiment, the condition of implant energy and implant dose for forming the highly doped impurity regions 11 is equal to that of forming the highly doped impurity areas 6b.

As shown in FIG. 10, like FIG. 7 relative to the first embodiment, within the semiconductor substrate 1 below the bottom of the contact holes 8a used to form the high doped impurity regions 11, using the interlayer insulating film 8 as a mask, N-type impurities are ion-implanted with low dose and high implant energy to form the N-type lightly doped impurity regions 12.

Specifically, for example, phosphorus ions that are N-type impurities are ion-implanted with implanting energy of 50 to 200 KeV and dose of $1\times10^{13}$ to $3\times10^{13}$ cm$^{-2}$.

Within the contact holes 8a and on the interlayer insulating film 8, a metallic wiring layer 9a constituting the metallic wiring 9 is formed. Using the ordinary photolithography, as shown in FIG. 8, the metallic wiring 9 is formed.

In this embodiment, the provision of the highly doped impurity region 11 provides an ohmic contact of the metallic wiring 9 with the source and drain region 6.

Further, in this embodiment also, the lightly doped impurity region 12 is formed around the highly doped impurity region 11. For this reason, the lightly doped impurity region 12 serves to relax the electric field applied to the highly doped impurity region 11 so that the withstand voltage of the contact area 14 can be boosted. Further, since the depletion layer of the lightly doped impurity region 12 is extended, the junction leak or junction capacitance of the contact area 14 can be reduced.

In this embodiment, the conductivity type of each of the semiconductor substrate 1, source and drain regions 6, impurity regions 11, 12 can be reversed (for example, an N-type Si substrate is used as the semiconductor substrate 1). In this case also, the same advantage or effect as described above can be obtained.

Embodiment 3

Figure 11:
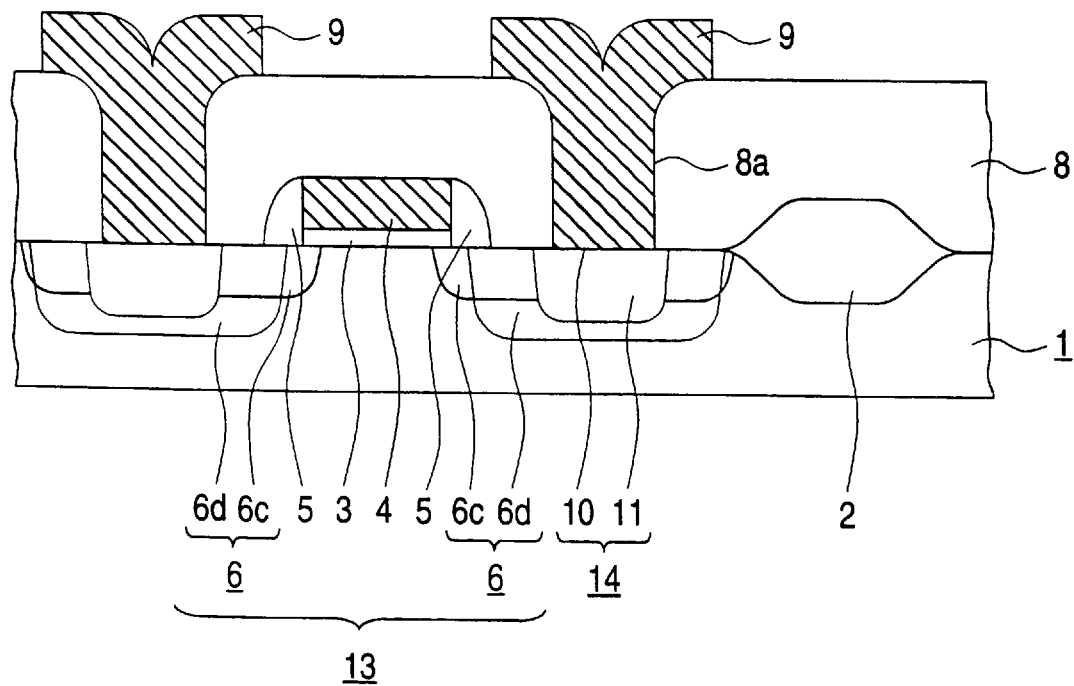
FIG. 11 is a major sectional view of the third embodiment of the present invention.
Figure 12:
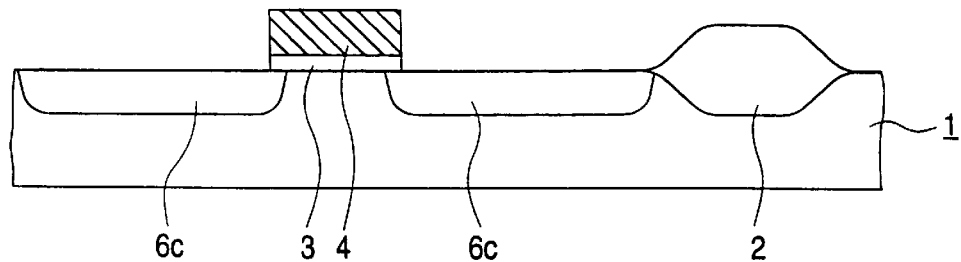
FIGS. 12 to 16 are major sectional views showing the second embodiment of the present invention in the order of manufacturing steps.

Now referring to FIGS. 11 to 16, an explanation will be given of the third embodiment of the present invention. FIG. 11 shows a major sectional view showing the third embodiment of the present invention. In this figure, reference numeral 1 denotes a semiconductor substrate made of P-type silicon (Si), and reference numeral 2 denotes an insulating film formed on a surface of the semiconductor substrate and serving as an isolation oxide film for electrically isolating elements from each other.

Reference numeral 3 denotes a gate insulating film made of silicon oxide formed on the semiconductor substrate 1; 4 denotes a gate electrode of polycrystalline silicon (poly-Si) formed on the gate insulating film 3; 5 denotes one of side walls of TEOS formed on both sides of the gate insulating film 3 and gate electrode 4; 6c denotes one of first N-type impurity lightly doped areas of respective N-type source and drain regions 6 which are located at a portion just below the gate electrode 4 and also its outside; and 6d denotes one of second N-type impurity lightly doped areas of respective source and drain regions 6 formed in the surface of the semiconductor substrate, formed at positions further outside and deeper than the lightly doped areas 6c below the gate electrode 4.

Reference numeral 8 denotes an interlayer insulating film formed on the semiconductor substrate 1 and having a contact holes 8a opening into the surface of the semiconductor substrate 1; 9 denotes one of metallic wirings made of e.g. aluminum (Al) each having a contact face with the semiconductor substrate 1 at the bottom of the contact hole 8a and extending onto the interlayer insulating film 8 from the contact face 10 through the contact hole 8a; and 11 denotes one of highly doped N-type impurity regions each formed within the semiconductor substrate 1 below the contact face 10. For example, their impurity concentration is $1\times10^{19}$ cm$^{-3}$ or more.

It should be noted that the metallic wiring 9 and the source and drain region 6 are electrically connected to each other through the highly-doped impurity region 11.

Reference numeral 13 denotes an N-channel MOSFET including the gate electrode 4, source and drain regions 6, etc., and reference numeral 14 denotes a contact area including the contact face 10, impurity region 11, etc.

Referring to FIGS. 12 to 16, an explanation will be given of a method of manufacturing the semiconductor device thus constructed. FIGS. 12 to 16 show the semiconductor device according to the third embodiment in the order of steps.

First, as shown in FIG. 2, on a surface of the semiconductor substrate 1, the silicon oxide film constituting the gate insulating film 3 and the poly-Si layer constituting the gate electrode 4 are successively stacked. Using the photolithography, the gate insulating film 3 and the gate electrode 4 are formed.

Using as a mask these gate insulating film 3, gate electrode 4 and isolation oxide film 2, N-type impurities such as phosphorus (P) ions are ion-implanted into the substrate 1, thus forming the first lightly doped areas 6c of source and drain regions.

Figure 13:
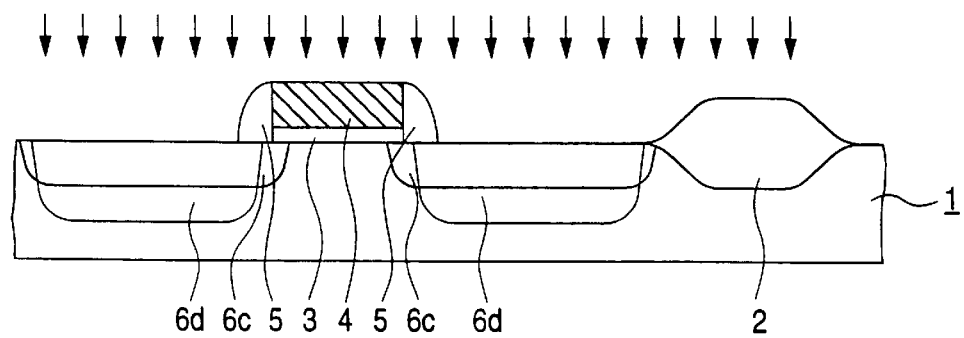

As shown in FIG. 13, on the surface of the semiconductor substrate 1 and the gate electrode 4, a TEOS film constituting the side walls 5 is formed, and by anisotropic etching of the TEOS film, the side walls 5 are formed.

Using as a mask the side walls 5, gate insulating film 3, gate electrode 4 and isolation oxide film 2, N-type impurity ions such as phosphorus ions are implanted into the substrate 1 to reach a deeper level than the first light lightly doped areas 6c, thus forming the second lightly doped areas 6d of the source drain regions.

Specifically, for example, phosphorus ions that are N-type impurities are ion-implanted with implanting energy of 50 to 200 KeV and dose of $1 \times 10^{13}$ to $3 \times 10^{13}$ cm$^{-2}$.

Figure 14:
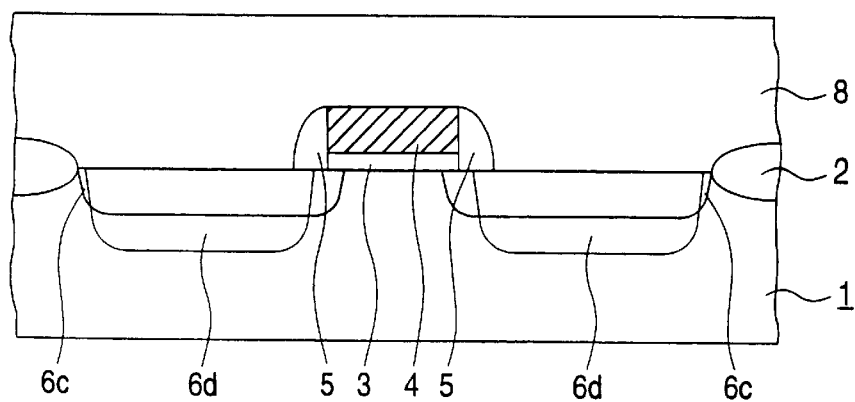

As shown in FIG. 14, on a surface of the semiconductor substrate 1, the interlayer insulating film 8 made of a silicon oxide film is formed. Thereafter, by etching, a substantially flat surface is obtained.

Figure 15:
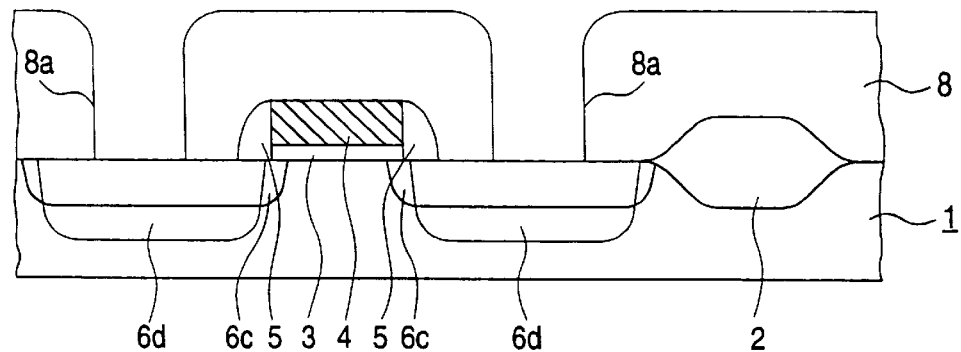

As shown in FIG. 15, using photolithography, contact holes 8a each opening into the corresponding source or drain region 6 are formed.

Figure 16:
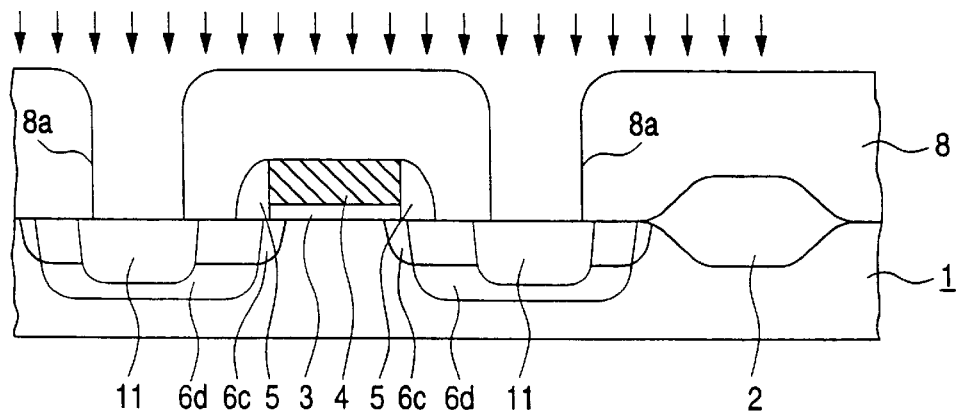

As shown in FIG. 16, within the semiconductor substrate 1 below the bottom of each of the contact holes 8a, using as a mask the interlayer insulating film 8, N-type impurities are ion-implanted with a high dose and low energy to form the N-type highly doped impurity regions 11.

Specifically, for example, phosphorus ions that are N-type impurities are ion-implanted with implanting energy of 30 to 100 KeV and dose of $1 \times 10^{14}$ to $1 \times 10^{15}$ cm$^{-2}$.

Within the contact holes 8a and on the interlayer insulating film 8, a metallic wiring layer 9a constituting the metallic wiring 9 is formed. Using the ordinary photolithography, as shown in FIG. 11, the metallic wiring 9 is formed.

In the semiconductor device thus constructed, the second lightly doped impurity areas 6d are formed at a deeper level than the highly doped impurity regions 11. For this reason, the lightly doped impurity area 6d serve to relax the electric field applied to the highly doped impurity regions 11 so that the withstand voltage of the contact area 14 can be boosted. Further, since the depletion layer of each of the lightly doped impurity regions 6d is extended, the junction leak or junction capacitance of the contact area 14 can be reduced.

In this embodiment, the conductivity type of each of the semiconductor substrate 1, source and drain regions 6, impurity region 11 can be reversed (for example, an N-type Si substrate is used as the semiconductor substrate 1). In this case also, the high withstand voltage can be obtained.

Embodiment 4

Figure 17:
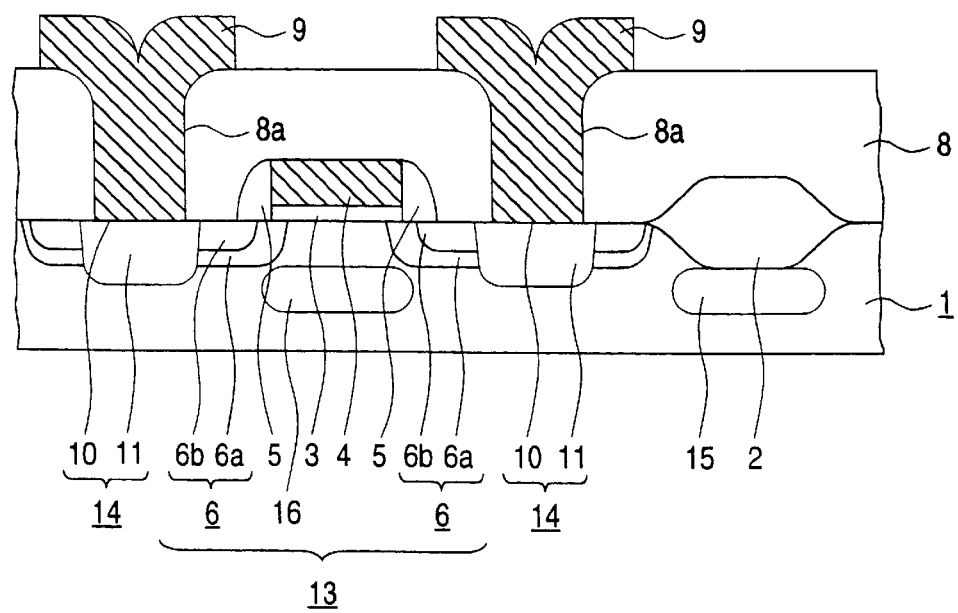
FIG. 17 is a major sectional view of the fourth embodiment of the present invention.

FIG. 17 shows the fourth embodiment of the present invention. This embodiment is different from the first embodiment in that a first P-type highly-doped region 15 is formed within the semiconductor substrate 1 below the isolation oxide film 2, a second P-type highly-doped region 16 for controlling the threshold voltage and punch-through is formed within the semiconductor substrate 1 below the gate electrode 7, but no other P-type highly doped region is formed at any other portions within the semiconductor substrate 1; and the lightly-doped impurity region 12 is not formed around the highly-doped impurity region 11.

Figure 18:
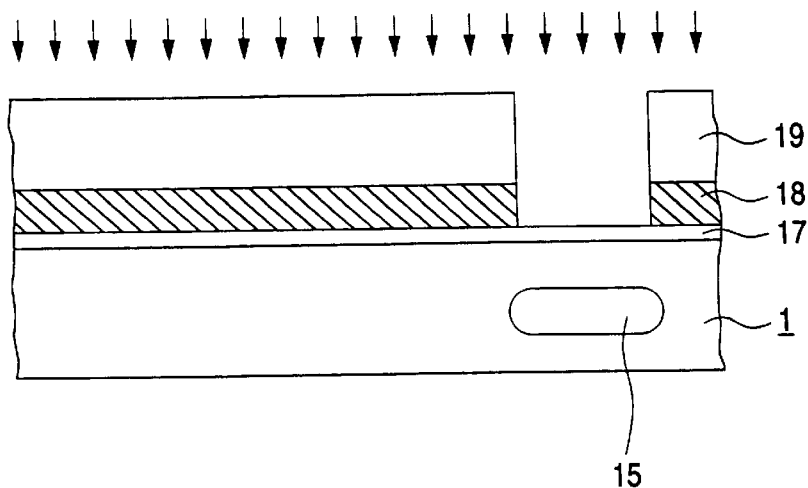
FIGS. 18 to 20 are major sectional views showing the fourth embodiment of the present invention in the order of manufacturing steps.
Figure 19:
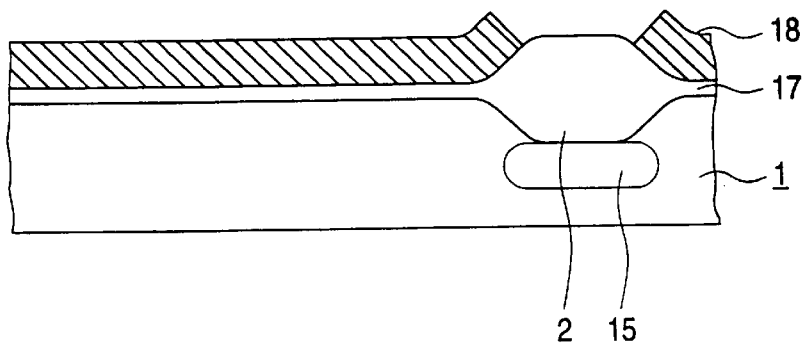
Figure 20:
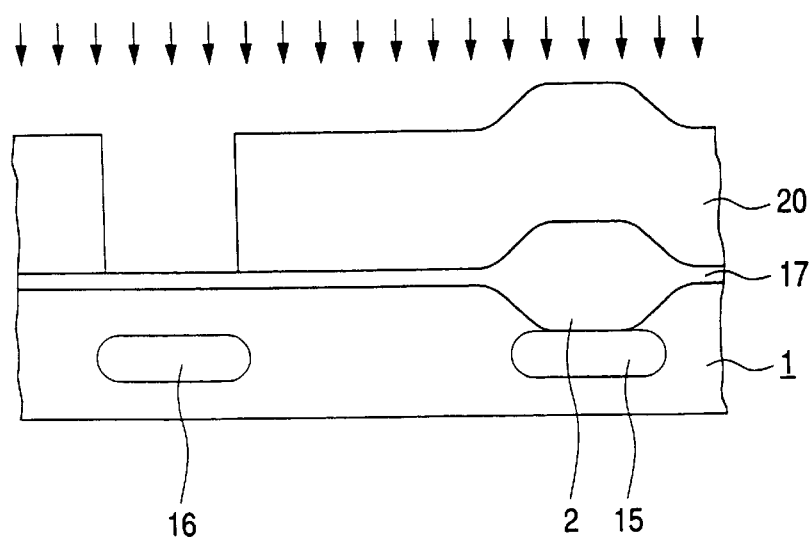

Now referring to FIGS. 18 to 19, an explanation will be given of a method of manufacturing the semiconductor device according to the fourth embodiment. FIGS. 18 to 20 show the semiconductor device according to the fourth embodiment in the order of manufacturing steps.

As shown in FIG. 18, on the semiconductor substrate 1, an oxide film 17 having a thickness of about 300 nm is formed. On the oxide film 17, a oxidation-resistant nitride film 18 having a thickness of 50–200 nm is formed. Onto the nitride film 18, resist 19 is applied. Using the ordinary photolithography, the resist 19 is patterned to open into a region where an isolation oxide film 2 is to be formed at a later step. Using the resist 19 as a mask, etching is performed to pattern the nitride film 18. Using as a mask the pattered resist 19 and nitride film 18, P-type impurities such as boron are highly implanted into the substrate 1 to form the first P-type highly doped impurity region 15.

As shown in FIG. 19, the resist 19 is etched away, and using the nitride film 18 as an oxidation resistant mask, oxidation is performed to form the isolation oxide film 2.

As shown in FIG. 20, the nitride film 18 is etched away and resist 20 is applied. Using the ordinary photolithography, the resist 20 is patterned to open into a region where the gate electrode 4 is to be formed at a later manufacturing step. At this time, specifically, patterning is carried out, for example, using a mask with its light transmitting portion and light shading portion inverted from those of a photolithographic mask used in forming the gate electrode 4 and the resist 20 having the same polarity (negative or positive) as that of the resist used in forming the gate electrode 4, or otherwise using the mask for forming the gate electrode and the resist having a different polarity from that of the resist used in forming the gate electrode.

Using the patterned resist 20 as a mask, P-type impurities such as boron are highly implanted to form the second P-type highly doped impurity region 16.

Thereafter, the resist 20 is etched away. The process after the etching of the resist 20 is the same as that in the first embodiment (FIGS. 2 to 6) except the step shown in FIG. 7.

In the fourth embodiment, the P-type highly doped impurity regions 15 and 16 are located not adjacently to but apart from the N-type highly doped impurity region 11, and the semiconductor substrate has a low impurity concentration of $1 \times 10^{15}$–$1 \times 10^{17}$ cm$^{-3}$. For this reason, the depletion layer of the highly doped impurity region 11 reaches a deep position of the semiconductor substrate so that the electric field of the contact area 14 can be relaxed to realize the high withstand voltage of the contact area 14. Further, since the depletion layer of the highly doped region 11 is extended, the junction leak or junction capacitance of the contact area 14 can be reduced.

In this embodiment, the conductivity type of each of the semiconductor substrate 1, source and drain regions 6, impurity regions 11, 12 can be reversed (for example, an N-type Si substrate is used as the semiconductor substrate 1). In this case also, the high withstand voltage can be obtained.

Embodiment 5

Figure 21:
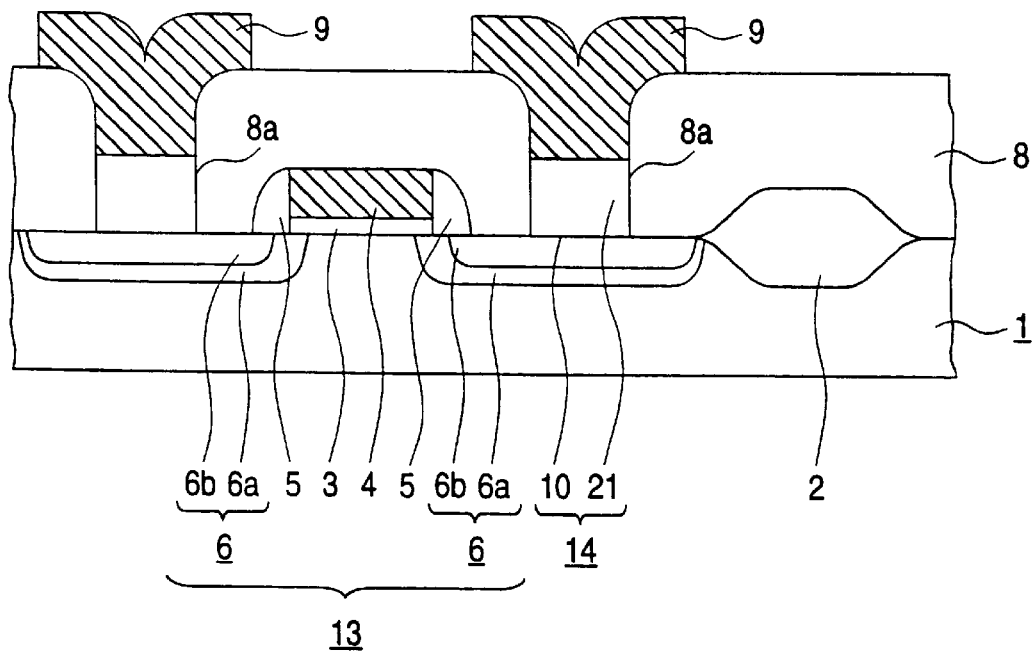
FIG. 21 is a major sectional view of the fifth embodiment of the present invention.
Figure 22:
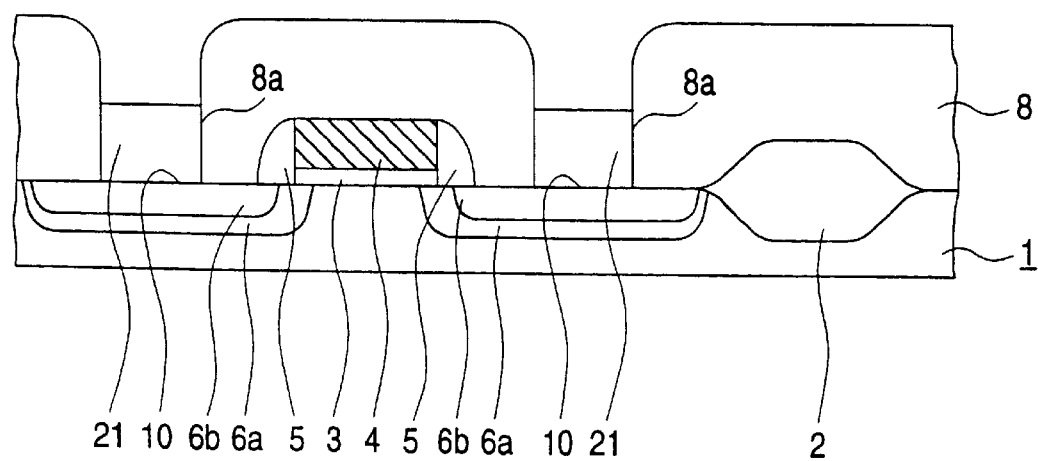
FIG. 22 is a major sectional views showing the fifth embodiment of the present invention in the order of manufacturing steps.
Figure 23:
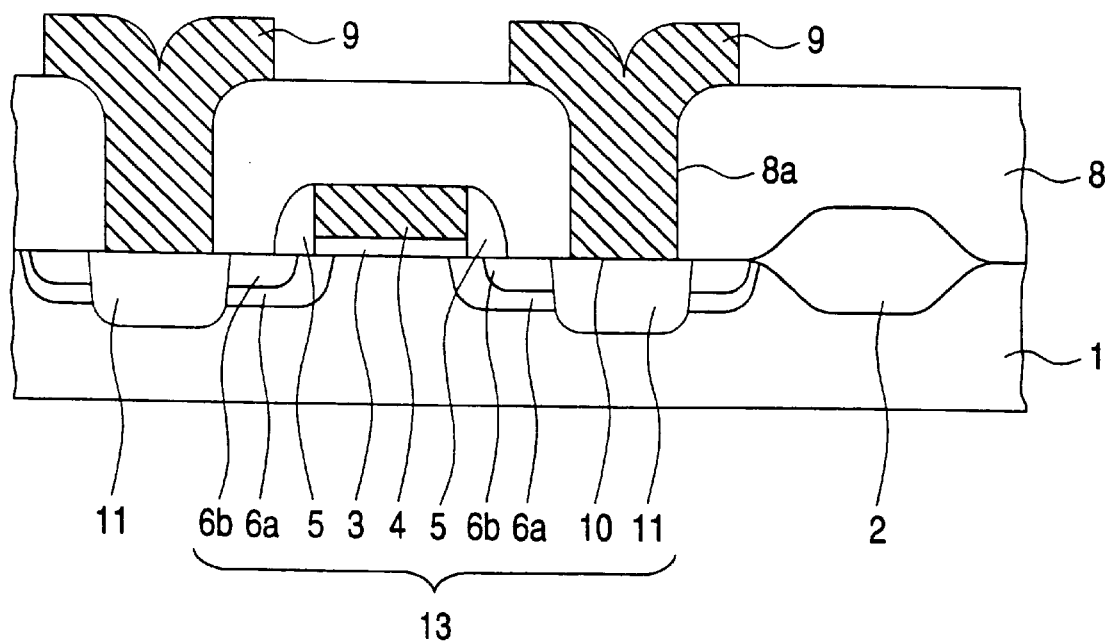
FIG. 23 is a major sectional view showing a conventional semiconductor device.

Referring to FIGS. 21 and 22, an explanation will be given of this embodiment. FIG. 21 is a major sectional view of the fifth embodiment of the present invention. This embodiment is different from the first embodiment as shown in FIG. 1 in only that in place of the N-type highly doped impurity region 11 and the lightly doped impurity region 12, on the semiconductor substrate 1 within each of the contact holes 8a, an epitaxial layer 21 containing N-type highly doped impurities is formed.

Referring to FIG. 22, an explanation will be given of a method of manufacturing the semiconductor device thus structured.

In this embodiment also, the process to the step of forming the contact holes 8a is the same as in the first embodiment as shown in FIGS. 2 to 5.

After the contact holes 8a are formed, as shown in FIG. 22, on the semiconductor substrate 1 within each of the contact holes 8a, an epitaxial layer 21 containing N-type highly doped impurities is formed.

Specifically, for example, the epitaxial layer 21 is formed to have an impurity concentration of $1 \times 10^{19}$ to $3 \times 10^{20}$ cm$^{-3}$ and a thickness of 500 nm.

Thereafter, on the epitaxial layer 21 and within the contact holes 8a and on the interlayer insulating film 8, a metallic wiring layer 9a constituting the metallic wiring 9 is formed. Using the ordinary photolithography, as shown in FIG. 21, the metallic wiring 9 is formed.

In the semiconductor device thus constructed, within each of the contact holes 8a opening into the source and drain regions 6, the epitaxial layer 21 containing highly doped impurities is formed. For this reason, the lightly doped impurity region 6a of the source and drain region serves to relax the electric field applied to the highly doped impurity region 6b so that the withstand voltage of the contact area 14 can be boosted. Further, since the depletion layer of the lightly doped region 6a is extended, the junction leak or junction capacitance of the contact area 14 can be reduced.

In this embodiment, the conductivity type of each of the semiconductor substrate 1, source and drain regions 6, epitaxial layer 21 can be reversed (for example, an N-type Si substrate is used as the semiconductor substrate 1). In this case also, the same advantage or effect as described above can be obtained.

What is claimed is:

1. A method of manufacturing a semiconductor device comprising the steps of:

forming a gate electrode over a gate region on a surface of a semiconductor substrate of a first conductivity type;

forming doped source and drain regions within the surface of the semiconductor substrate, wherein said doped source and drain regions together with said gate electrode form a MOSFET of a second conductivity type;

forming an interlayer insulating film having respective contact holes with openings exposing the doped source and drain regions;

forming a respective highly doped contact impurity region of the second conductivity type within each of said doped source and drain regions below the bottom of each respective contact hole;

forming a respective lightly doped contact impurity region of the second conductivity type around each said respective highly doped contact impurity region; and forming a metallic wiring electrically connected to each said respective highly doped contact impurity region and extending onto said interlayer insulating film through each said respective contact hole.

2. The method of manufacturing a semiconductor device according to claim 1, wherein each respective highly doped contact impurity region is formed by ion implantation with an energy of predetermined value using said interlayer insulating film as a mask, and each said respective lightly doped contact impurity region is formed by ion implantation with energy of a larger value than the predetermined value using said interlayer insulating film as a mask.

3. The method of manufacturing a semiconductor device according to claim 1, wherein each respective highly doped contact impurity region is formed by ion implantation of arsenic or phosphorus with low energy using said interlayer insulating film as a mask, and each said respective lightly doped contact impurity region is formed by ion implantation of phosphorus with high energy using said interlayer insulating film as a mask.

4. The method of manufacturing a semiconductor device according to claim 1, wherein each said respective lightly doped contact impurity region is formed by ion implantation with energy of 50–200 KeV.

5. The method of manufacturing a semiconductor device according to claim 1, further comprising prior to forming said MOSFET of a second conductivity type, the steps of:

forming a first highly doped impurity region of the first conductivity type within said semiconductor substrate below an isolation oxide film extending over a first range of depths by ion implantation using resist as a mask; and forming a second highly doped impurity region of the first conductivity type within the semiconductor substrate below the gate region by ion implantation through a resist mask opening at a second range of depths below the surface of the semiconductor substrate at least partly overlapping the first range of depths.

6. The method of manufacturing a semiconductor device according to claim 1, wherein said highly doped contact impurity region is formed by ion implantation using the interlayer insulating film as a mask.

7. The method of manufacturing a semiconductor device according to claim 1, wherein said lightly doped contact impurity region is formed by ion implantation with energy of 50–200 KeV.

8. The method of manufacturing a semiconductor device according to claim 1, further comprising, prior to forming said MOSFET of a second conductivity type, the steps of:

forming a first highly doped impurity region of the first conductivity type within said semiconductor substrate below an isolation oxide film extending over a first range of depths by ion implantation using resist as a mask; and forming a second highly doped impurity region of the first conductivity type within the semiconductor substrate below the gate region by ion implantation through a resist mask opening at a second range of depths below the surface of the semiconductor substrate at least partly overlapping the first range of depths.

9. The method of manufacturing a semiconductor device according to claim 1, wherein the step of forming each respective highly doped contact impurity region of the second conductivity type within each of said doped source and drain regions below the bottom of each respective contact hole is done such that each respective highly doped contact impurity region of the second conductivity type is formed at a level which does not extend deeper than a depth of the associated source and drain regions.

* * * * *